United States Patent
Jonas

(10) Patent No.: US 7,649,352 B2
(45) Date of Patent: Jan. 19, 2010

(54) MAGNETIC FIELD SENSOR

(75) Inventor: Peter Jonas, Konz (DE)

(73) Assignee: IEE International Electronics & Engineering S.A., Luxembourg (LU)

( * ) Notice: Subject to any disclaimer, the term of this patent is extended or adjusted under 35 U.S.C. 154(b) by 0 days.

(21) Appl. No.: 11/915,963

(22) PCT Filed: Jun. 7, 2006

(86) PCT No.: PCT/EP2006/062973

§ 371 (c)(1),
(2), (4) Date: Jul. 23, 2008

(87) PCT Pub. No.: WO2006/131535

PCT Pub. Date: Dec. 14, 2006

(65) Prior Publication Data

US 2009/0102476 A1 Apr. 23, 2009

(30) Foreign Application Priority Data

Jun. 7, 2005 (EP) .................................. 05104949

(51) Int. Cl.
*G01R 33/02* (2006.01)
*G01B 7/00* (2006.01)

(52) U.S. Cl. ................... 324/244; 324/207.24

(58) Field of Classification Search ............ 324/207.11, 324/207.13, 207.2, 207.21, 207.24, 244, 324/260, 658, 661–662, 686–687; 338/99; 73/862.69

See application file for complete search history.

(56) References Cited

U.S. PATENT DOCUMENTS

| 3,418,850 | A | | 12/1968 | Goddin |
| 5,079,536 | A | * | 1/1992 | Chapman ..................... 338/99 |
| 5,132,658 | A | | 7/1992 | Dauenhauer et al. |
| 6,429,652 | B1 | | 8/2002 | Allen et al. |
| 6,765,394 | B1 | | 7/2004 | Igel et al. |
| 7,543,510 | B2 | * | 6/2009 | Bieck et al. ................... 73/862 |
| 2005/0128047 | A1 | * | 6/2005 | Watanabe et al. ............. 338/47 |

OTHER PUBLICATIONS

International Search Report; PCT/EP2006/062973; Dec. 12, 2006.

\* cited by examiner

*Primary Examiner*—Bot L LeDynh
(74) *Attorney, Agent, or Firm*—Cantor Colburn LLP

(57) ABSTRACT

A magnetic field sensor comprises a first and a second carrier foil and a spacer arranged there between. The spacer delimits a sensing region of the sensor in which the first and second carrier foils can be brought together against the their resiliency. At least two electrodes are arranged in the sensing region in such a way that an electrical contact is provided between them when the first and second carrier foils are brought together. The magnetic field sensor further comprises additional magnetizable layer associated with the first or the second carrier foil so that the first and second carrier foils can be brought together in response to a magnetic field.

15 Claims, 3 Drawing Sheets

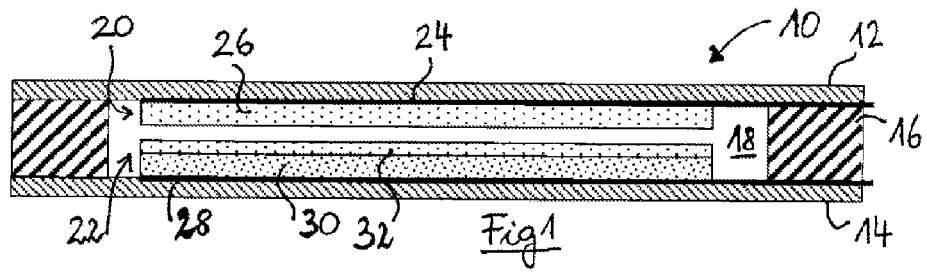
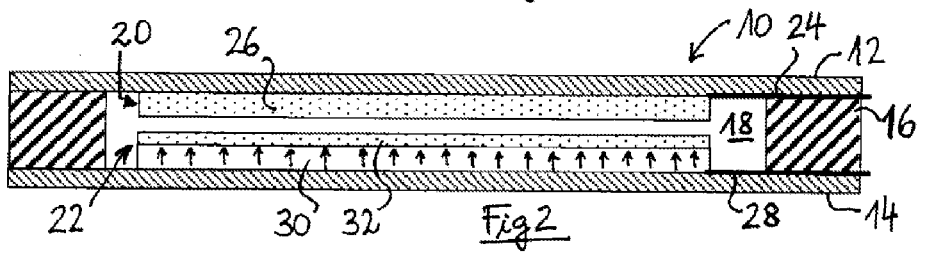
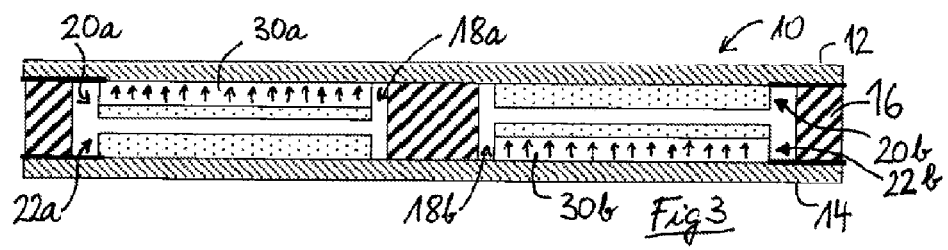
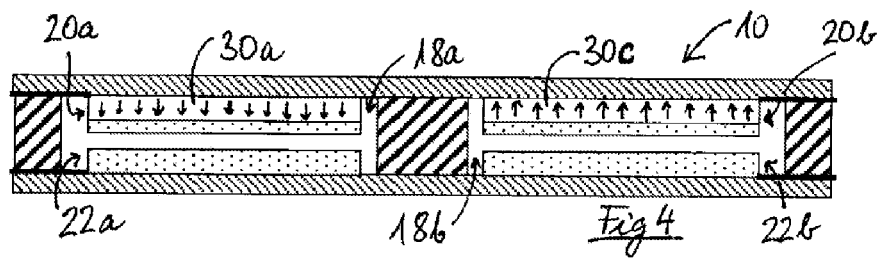
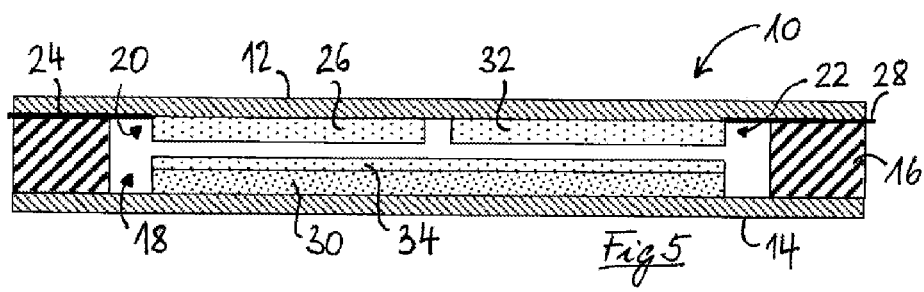
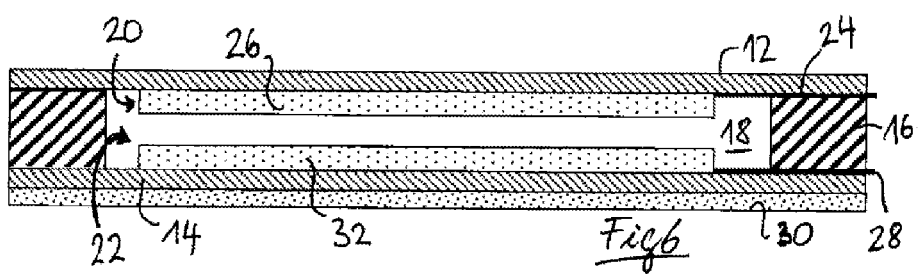

MAGNETIC FIELD SENSOR

TECHNICAL FIELD OF THE INVENTION

The present invention generally relates to magnetic field sensors.

BRIEF DESCRIPTION OF RELATED ART

Magnetic field sensors generally allow indirect detection of magnetic field properties. Several types of magnetic field sensors are known. Hall sensors are based on the Hall effect and measure the magnetic field strength via the voltage that builds up perpendicular to a current flow. Another kind of sensors is based on magnetoresistance, e.g. giant magnetoresistance (GMR), colossal magnetoresistance (CMR) or tunnel magnetoresistance (TMR). These are quantum effects, where the mobility of electrons is influenced by the external magnetic field. Other sensors are based on materials changing their optical properties in a magnetic field. Magnetic field properties can also be measured using the fact that the resonant frequency of a resonant circuit is shifted by an external magnetic field. Sensors based on reed switches are also well known.

BRIEF SUMMARY OF THE INVENTION

The Invention Provides a Different Magnetic Field Sensor.

A magnetic field sensor comprises a first and a second carrier foil and a spacer arranged there between. The spacer delimits a sensing region of the sensor in which the first and second carrier foils can be brought together against their resiliency. At least two electrodes are arranged in the sensing region in such a way that an electrical contact is provided between them when the first and second carrier foils are brought together. The magnetic field sensor further comprises an additional magnetisable layer associated with the first or the second carrier foil so that the first and second carrier foils can be brought together in response to a magnetic field. Such a magnetic field sensor for measuring certain properties of an external magnetic field can be produced using printing techniques like lithography, screen-printing, inkjet-printing or another printing method which are well-suited for mass production. Flexible materials (e.g. polymer foils) are used so that the magnetic field sensor is suitable for application on curved surfaces. The carrier foils can comprise several individual layers with different properties. It is, however, also possible to combine all necessary properties in one layer. An electronic control unit can be operatively connected to the magnetic field sensor, which can be fed with low AC voltage. The fact that a separate layer is provided as the magnetisable layer confers a high amount of design freedom: magnetic properties can be chosen independently from the electric properties of the conductors. It may furthermore be wished to have a planar magnetisable layer and conductors that have an annular or ramified structure. Shaping of the magnetisable layer and the conductors can be done independently. As the skilled person will appreciate, the magnetisable layer can be arranged on any surface of the first carrier foil, either on the surface facing the second carrier foil or on the opposite surface. The magnetisable layer may further extend outside the sensing region.

The magnetisable layer may comprise soft- or hard-magnetic material, depending on the desired properties of the sensor. When soft-magnetic material is used, a magnetic field of moderate strength causes a magnetisation having the same orientation as the magnetic field; a magnet therefore attracts the magnetisable layer. When using magnetically harder material, moderate magnetic fields do not affect the magnetisation significantly, so that a region with higher field strength can attract or repulse the magnetisable layer depending on the relative orientations of the external field lines and the magnetisation of the magnetisable layer. The magnetisable material is preferably ferromagnetic, but ferrimagnetic materials can also be used. Magnetic materials are well known and involve numerous compounds of Fe, Ni, Co or Ga.

According to a first embodiment of the invention, the two electrodes are arranged together on the first carrier foil. To provide the electrical contact when the carrier foils are brought together, the magnetic field sensor further comprises a contact element arranged on the second carrier foil in facing relationship to the two electrodes. Such a sensor has the advantage that the electric connection lines can be arranged on the same carrier foil. Printing or depositing of the connection lines on the carrier foil can be done in a single process step. The electrode and the contact element may be made of electrically conducting material exclusively but, preferably, at least one of the electrodes or the contact element may comprises a resistive layer, through which the electrical contact is provided. The electrical resistance between the connection lines then depends on the parameters of the resistive layer and the contact area of the resistive layer and the opposed electrode or contact element. The electrodes may also comprise a plurality of respectively conducting and resistive layers.

In a preferred second embodiment of the invention, the first electrode of the at least two electrodes is arranged on the first carrier foil and the second electrode of the at least two electrodes is arranged on the second carrier foil in facing relationship with the first electrode. In this case, an additional contact element is not necessary.

Advantageously, at least the first electrode comprises a resistive layer that faces the second electrode. The electrical contact between the first and the second electrode is provided at a contact area between the resistive layer and the second electrode. When the contact area increases, the resistance of the magnetic field sensor decreases. Measuring the resistance, the voltage or the current through the electrodes hence allows determining certain parameters of the magnetic field. It is possible to further provide the resistive layer with a pressure-dependent resistivity. In this case, the resistance depends also on the pressure between the electrodes when they are in contact.

In response to a magnetic field, a mechanical contact area is formed between the carrier foils. Part of the mechanical contact area constitutes an electrical contact area between the second electrode and the resistive layer of the first electrode. In an interesting variant of the invention, the resistive layer has a shape such that the electrical contact area and the mechanical contact area mismatch. Such a configuration allows tailoring the electrical response as a function of the magnetic force by appropriately shaping the resistive layer. The first electrode may, for instance, comprise a first peripheral conductor arranged substantially in the periphery of the sensing region and a first resistive layer extending inwardly from the first peripheral conductor. The second electrode may comprise, in facing relationship to the first resistive layer, a planar conductor or a second peripheral conductor and a second resistive layer extending inwardly from the second peripheral conductor.

It should be noted that in case the first or the second electrode comprises a planar conductor covering substantially the entire sensing region, those parts of the planar conductor that are not coated with resistive material may be coated with insulating material in order to prevent a direct contact between conductors of the electrodes.

In a further embodiment of the invention, the resistive layer of the first electrode comprises a resistive strip arranged in facing relationship with a conductive strip of the second electrode in a potentiometer-like arrangement. In response to a local magnetic field, the resistive strip and the conductive strip are thus locally brought together. The resistance of the magnetic field sensor depends on the relative position of the local magnetic field along the direction of the resistive or the conductive strip. Accordingly, a contactless position sensing system comprises such a magnetic field sensor and a magnetic member, the position of which is to be sensed. A great advantage is that continuous position detection is possible with this setup and that one is not limited to a discrete resolution as for example when using Hall sensors. It will be appreciated that such a position sensing system can be used for detecting the position of a vehicle seat. The magnetic member can be integrated into the vehicle seat, and the magnetic field sensor can be arranged in the floor of the passenger compartment. The magnetic member advantageously comprises a permanent magnet, so that a power source is not required. This is particularly useful if the seat can be removed completely from the vehicle, because the user does not need reconnecting any electric cables.

It will be appreciated that a magnetic field sensor may also comprise more than one sensing region in which the first and second carrier foils can be brought together. Each sensing region then comprises a magnetisable layer and at least two electrodes arranged in such a way that an electrical contact is provided between the electrodes when the first and second carrier foils are brought together. The arrangement of the magnetisable layers in the sensing regions is such that, in response to a magnetic field, an electrical contact is provided in only one of the sensing regions. For example, when the magnetisable layers have magnetisations oriented in opposite directions, the magnetisable layers are associated with the same carrier foil. When the magnetisable layers have magnetisations oriented in the same direction, the first magnetisable layer is associated in the first sensing region with the first carrier foil and the second magnetisable layer is associated with the second carrier foil in the second sensing region. Such a configuration allows detection of the orientation of the magnetic field. The skilled person will appreciate that, in case the magnetisable layers are arranged on the same carrier foil, they may can be separate or form together a continuous layer having domains of opposite magnetisation.

BRIEF DESCRIPTION OF THE DRAWINGS

Preferred embodiments of the invention will now be described, by way of example, with reference to the accompanying drawings in which:

FIG. 1: is a cross sectional view of a magnetic field sensor with a soft-magnetic layer;

FIG. 2: is a cross sectional view of a magnetic field sensor with a hard-magnetic layer;

FIG. 3: is a magnetic field sensor capable of detecting magnetic field direction;

FIG. 4: is a variant of the magnetic field sensor of FIG. 3.

FIG. 5: is a cross-sectional view of a magnetic field sensor, which comprises a contact element for establishing contact between the two electrodes;

FIG. 6: is a cross sectional view of another embodiment of a magnetic field sensor;

DETAILED DESCRIPTION OF THE INVENTION

Figure 7:
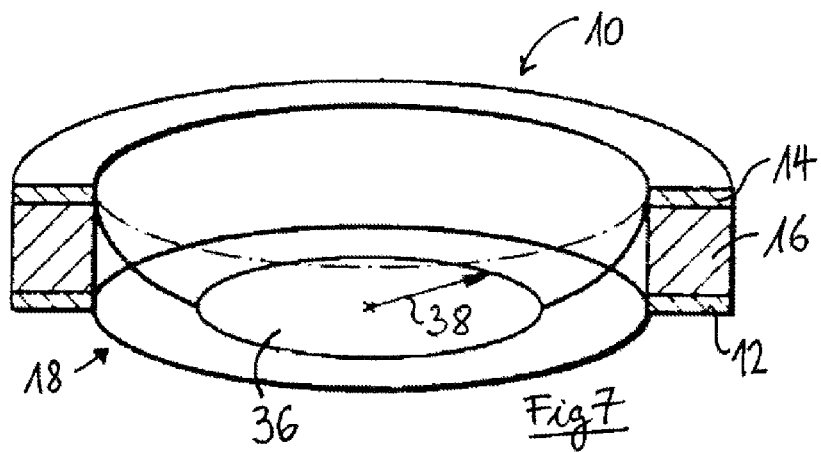
FIG. 7: is a representation of a circular magnetic field sensor, wherein the carrier foils are brought together in response to a magnetic field.

FIGS. 1 and 2 generally represent a magnetic field sensor 10 carried out in foil-type construction. The magnetic field sensor comprises a first carrier foil 12 and a second carrier foil 14, spaced apart by a spacer 16. The spacer 16 delimits an opening, which constitutes the sensing region 18 of the magnetic field sensor 10. In the sensing region 10, the first and the second carrier foils 12, 14 can be moved one towards the other by a force acting against the resiliency of the carrier foils 12, 14.

A first electrode 20 and a second electrode 22 are arranged in the opening of the spacer 16, respectively on the first and the second carrier foil 12, 14. The first electrode 20 comprises an electric conductor 24, deposited or printed on the surface of the first carrier foil 12 that faces the second carrier foil 14. A layer of resistive material 26 is arranged on the first carrier foil 12 so that it prevents direct contact between the conductor 24 and the second electrode 22.

The second electrode 22 is formed by a conductor 28, a magnetisable layer 30 and a resistive layer 32. The electric conductor 28 has been printed or deposited on the surface of the second carrier foil 14 that faces the first electrode 20. The magnetisable layer 30 is electrically conductive so as to allow passage of current between the conductor 28 and the resistive layer 32, which sandwich the magnetisable layer 30.

FIG. 1 shows a magnetic field sensor 10, wherein the magnetisable layer 30 is made of soft-magnetic material, i.e. a material that has a relatively low magnetic remanence. When the magnetic field sensor 10 is brought into an external magnetic field, the magnetisable layer 30 is magnetised so that the orientation of its poles match the orientation of the external magnetic field. When the magnetic field has a field gradient that is substantially transversal to the magnetisable layer 30, the latter is attracted towards the stronger magnetic field against the resilient forces of the second carrier foil 14. If the magnetic field is stronger on the side of the first carrier foil 12, then the resulting magnetic forces attract the magnetisable layer 30 towards the first carrier foil 12 and an electric contact between the first and second electrodes 20, 22 is provided when the electrodes 20, 22 touch each other in the sensing region 18. Upon increase of the magnetic forces, the mechanical contact area between the arrangement of the first carrier foil 12 and the arrangement of the second carrier foil 14 grows. Consequently the electrical contact area between the first and the second electrode increases and the resistance between the first conductor 24 and the second conductor 28 decreases. By measuring the resistance, the voltage or the current between the first and the second conductor 24, 28, one can thus determine the total magnetic force acting upon the sensor 10 or the magnetic field gradient.

FIG. 2 shows a variant of the magnetic field sensor 10 of FIG. 1. When the magnetisable layer 30 comprises magnetically harder material, the magnetic field strength of the external magnetic field may not be sufficient to reorient the magnetisation of the magnetisable layer 30. Depending on the orientation of the external magnetic field, the magnetisable layer 30 may hence be attracted or repelled from a region with a higher magnetic field strength. An electrical contact between the two electrodes 20, 22 is established in case the magnetic attraction or repulsion moves the magnetisable layer 30 together with its carrier foil 14 towards the opposite carrier foil 12. When the orientation of the magnetisation of the magnetisable layer 30 is known, the orientation of the external magnetic field can thus be determined.

In order to determine the orientation of an external magnetic field, a magnetic field sensor comprising at least two sensing regions can be used. FIG. 3 shows such a magnetic field sensor 10. The spacer 16 is provided with two openings defining the sensing regions 18a, 18b. The sensing regions 18a and 18b are respectively equipped with electrodes 20a, 22a and electrodes 20b, 22b. A layer 30a of hard-magnetic material is affixed upon the first carrier foil 12 in sensing region 18a and a another layer 30b of hard-magnetic material is affixed upon the second carrier foil 14 in sensing region 18b. The orientation of the magnetisation of the magnetic layers 30a, 30b is the same.

When the sensor 10 is put into an external magnetic field that has a field gradient that is substantially transversal to the plane of the magnetic layers 30a, 30b, one of the magnetic layers is attracted towards the opposite carrier foil, while the other one of the magnetic layers is repulsed from the opposite carrier foil. An electric contact is thus established between the electrodes in one of the sensing regions 18a, 18b and the orientation of the magnetic field can be determined when the orientation of the magnetisation of the magnetic layers 30a, 30b is known.

Analogously, magnetic field orientation can be determined with a magnetic field sensor as shown in FIG. 4. The hard-magnetic layers 30a, 30c are associated with the same carrier foil 12, but their magnetisations are opposite.

FIG. 5 shows another configuration of a magnetic field sensor 10. Within the sensing region 18 of the magnetic field sensor, a first electrode 20 and a second electrode 22 are arranged on the carrier foil 12. On the second carrier foil 14, a contact element 34 is arranged so that it faces the first and the second electrodes 20, 22. A layer 30 of magnetisable material is sandwiched between the contact element 34 and the second carrier foil 14. A magnetic force acting on the magnetisable layer 30 in direction of the first carrier foil 12 will cause the magnetisable layer 30 to move the second carrier foil 14 and the contact element 34 towards the first carrier foil 12. Above a certain threshold, determined by the resiliency of the second carrier foil 12 and the gap between the electrodes 20, 22 and the contact element 34, the contact element 34 will provide an electrical contact between the first and the second electrode 20, 22.

FIG. 6 shows a magnetic field sensor 10, wherein the magnetisable layer 30 is located on the surface of the second carrier foil 14 that faces away from the first carrier foil 12.

FIG. 7 represents a circular magnetic sensor 10 when the second carrier foil 14, which carries the magnetisable layer 30, is brought into contact with the first carrier foil 10 in the sensing region 18 in response to a magnetic field. The spacer 16 surrounds the circular sensing region 18 and does not collapse significantly when the carrier foils 12, 14 are brought together. The reaction force of the sensing element 10 is thus mainly due to the resiliency of the carrier foil 14. Under the action of a magnetic force, the second carrier foil 14 is bend towards the first carrier foil 12 until the electrode arrangements on the carrier foils 10, 12 come into mechanical contact. With an increasing magnetic force, the radius 38 of the mechanical contact area 36 grows. An electrical contact area between the electrodes 20, 22 is established where the resistive layer of one of the electrodes is in contact with the opposite electrode. The electrical contact area thus depends upon the shape of the resistive layer and the electrical response of sensor 10 as a function of the magnetic force can be tailored by appropriate shaping of at least one of the resistive layers. When the resistive layer covers the entire area of the sensing region 18 where the first and second carrier foils can be brought together, the electrical contact area will match the mechanical contact area 36.

Figure 8:
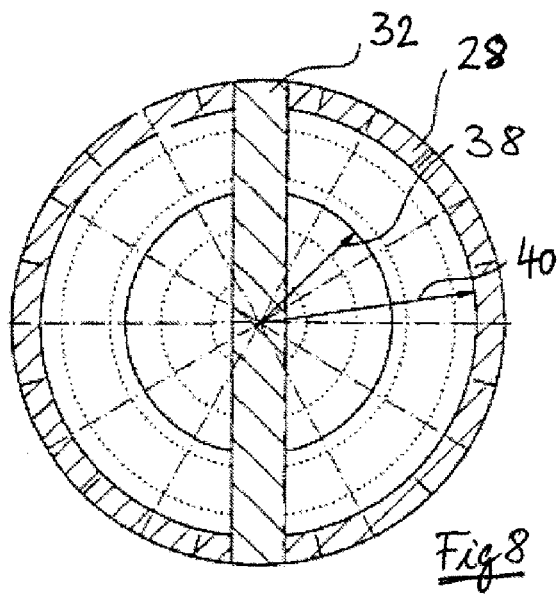
FIG. 8: is a schematic top view of an electrode arrangement comprising a resistive layer having the shape of a strip.
Figure 9:
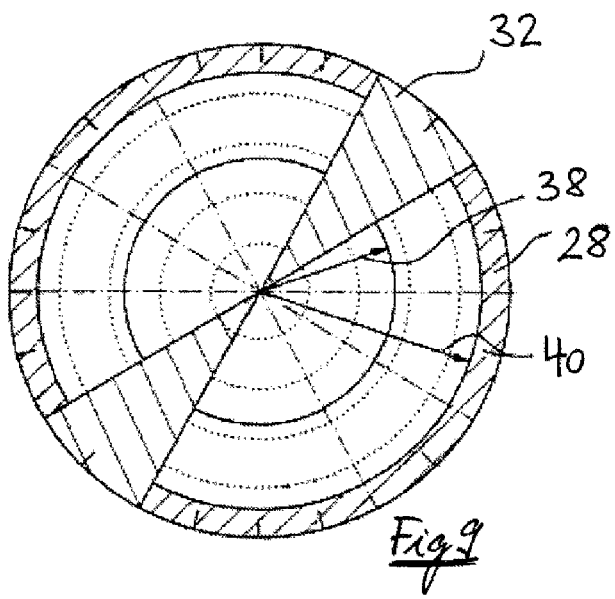
FIG. 9: is a schematic top view of an electrode arrangement comprising a resistive layer comprising two angular segments.

FIGS. 8 and 9 show configurations of the sensing region, wherein the first electrode 20 is disk-shaped and covers substantially the entire sensing region 18, while the second electrode 22 has a shape generating a mismatch of electrical and mechanical contact areas. The second electrode 22 comprises an annular conductor 28 of radius 40 arranged peripherally around the sensing region 18 and a resistive layer 32 extending inwardly from the peripheral conductor 28. FIG. 8 shows the resistive layer 32 comprising a resistive strip centrally traversing the sensing region 18. FIG. 9 shows the resistive layer 32 comprising angular segments tapering towards the centre of the sensing region 18. Manifold other shapes can indeed be envisaged, e.g. vortex segments spirally extending from the periphery to the centre of the sensing region, differently-shaped annular sections or cardioid-like designs.

Figure 10:
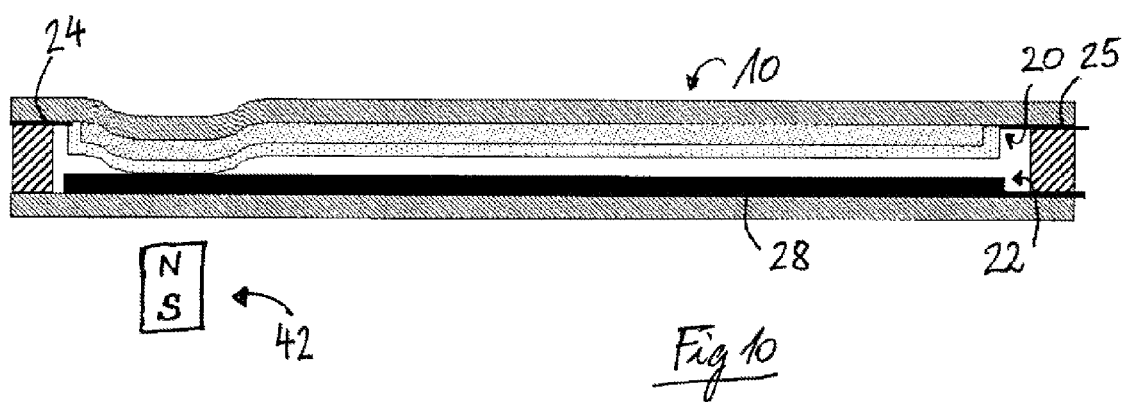
FIG. 10: is a cross sectional view of an elongated magnetic field sensor for sensing the position of a magnetic field.

Magnetic field sensors can e.g. be used in a contactless position sensing system. FIG. 10 shows an elongated magnetic field sensor 10 comprising two elongated strip-like electrodes 20, 22 facing each other in the sensing region of the sensor. The first electrode 20 comprises a resistive layer 26 that is connected with conductors 24, 25 at the opposed extremities with respect to its length. The second electrode 22 comprises a conductor 28 facing the resistive layer 26 over substantially its whole length. When a magnetic member 42, represented as a permanent magnet having a North pole N and a South pole S is moved along the magnetic field sensor 10, the contact spot between the first electrode 20 and the second electrode 22 follows the movement of the magnetic member 42. The electric resistance between conductors 24 and 28 or conductors 25 and 28 accordingly varies, which allows determining the position of the magnetic member 42.

The invention claimed is:

1. A magnetic field sensor comprising:
   a first carrier foil and a second carrier foil;
   a spacer in between said first and second carrier foils, said spacer delimiting a first sensing region in which the first and second carrier foils can be brought together against a resiliency of the carrier foils;
   at least two electrodes arranged in said first sensing region in such a way that an electrical contact is provided between said electrodes when said first and second carrier foils are brought together in said first sensing region; and
   an additional first magnetisable layer associated with said first or second carrier foil in said first sensing region so that said first and second carrier foils can be brought together in response to a magnetic field.

2. The magnetic field sensor according to claim 1, wherein said magnetisable layer comprises soft-magnetic material.

3. The magnetic field sensor according to claim 1, wherein said magnetisable layer comprises hard-magnetic material.

4. The magnetic field sensor according to claim 1, wherein said two electrodes are arranged together on said first carrier foil and wherein said magnetic field sensor further comprises a contact element arranged on said second carrier foil in facing relationship to said two electrodes.

5. The magnetic field sensor according to claim 4, wherein at least one of said electrodes or said contact element comprises a resistive layer, through which said electrical contact is provided.

6. The magnetic field sensor according to claim 1, wherein a first electrode of said at least two electrodes is arranged on said first carrier foil and a second electrode of said at least two electrodes is arranged on said second carrier foil in facing relationship with said first electrode.

7. The magnetic field sensor according to claim 6, wherein said first electrode comprises a resistive layer that faces said second electrode.

8. The magnetic field sensor according to claim 7, wherein said resistive layer has a pressure-dependent resistivity.

9. The magnetic field sensor according to claim 7, wherein, in response to a magnetic field, a mechanical contact area is formed between said carrier foils, part of said mechanical contact area being an electrical contact area formed between said resistive layer of the first electrode and the second electrode, and wherein said resistive layer has a shape such that said electrical contact area and said mechanical contact area mismatch.

10. The magnetic field sensor according to claim 9, wherein said first electrode comprises a peripheral conductor arranged substantially in a periphery of said sensing region, said resistive layer extending inwardly from said peripheral conductor and wherein said second electrode comprises a planar conductor arranged in facing relationship to said resistive layer.

11. The magnetic field sensor according to claim 9, wherein said first electrode comprises a first peripheral conductor arranged substantially in a periphery of said sensing region and a first resistive layer extending inwardly from said first peripheral conductor and wherein said second electrode comprises a second peripheral conductor and a second resistive layer extending inwardly from said second peripheral conductor.

12. The magnetic field sensor according to claim 7, wherein said resistive layer comprises a resistive strip and wherein said second electrode comprises a conductive strip arranged in facing relationship with said resistive strip, so that in response to a local magnetic field, said resistive strip and said conductive strip are locally brought together.

13. A contactless position sensing system comprising a magnetic field sensor according to claim 12 and a magnetic member, the position of which is to be sensed.

14. The magnetic field sensor according to claim 1, comprising:
- a second sensing region delimited by said spacer, in which the first and second carrier foils can be brought together against the resiliency of said carrier foils;
- at least two electrodes being arranged in said second sensing region in such a way that an electrical contact is provided between them when said first and second carrier foils are brought together in said second sensing region;
- a second magnetisable layer associated with said first carrier foil in said second sensing region; and
- wherein said first magnetisable layer is associated with said first carrier foil and wherein said magnetisable layers have magnetisations oriented in opposite directions.

15. The magnetic field sensor according to claim 1, comprising:
- a second sensing region delimited by said spacer, in which the first and second carrier foils can be brought together against the resiliency of said carrier foils,
- at least two electrodes being arranged in said second sensing region in such a way that an electrical contact is provided between them when said first and second carrier foils are brought together in said second sensing region; and
- a second magnetisable layer associated with said second carrier foil in said second sensing region; and
- wherein said first magnetisable layer is associated with said first carrier foil and wherein said magnetisable layers have magnetisations oriented in the same direction.

* * * * *